United States Patent
Moriyama et al.

(10) Patent No.: US 8,981,505 B2
(45) Date of Patent: Mar. 17, 2015

(54) MG DISCONTINUOUS INSERTION LAYER FOR IMPROVING MTJ SHUNT

(71) Applicant: Headway Technologies, Inc., Milpitas, CA (US)

(72) Inventors: Takahiro Moriyama, Tondabayashi (JP); Yu-Jen Wang, San Jose, CA (US); Ru-Ying Tong, Los Gatos, CA (US)

(73) Assignee: Headway Technologies, Inc., Milpitas, CA (US)

( * ) Notice: Subject to any disclaimer, the term of this patent is extended or adjusted under 35 U.S.C. 154(b) by 5 days.

(21) Appl. No.: 13/739,016

(22) Filed: Jan. 11, 2013

(65) Prior Publication Data

US 2014/0197504 A1    Jul. 17, 2014

(51) Int. Cl.
- H01L 29/82 (2006.01)
- H01L 21/8246 (2006.01)
- H01L 43/02 (2006.01)
- H01L 43/12 (2006.01)
- G11C 11/16 (2006.01)

(52) U.S. Cl.
CPC ............... H01L 43/02 (2013.01); H01L 43/12 (2013.01); G11C 11/161 (2013.01)
USPC .. 257/421; 438/3; 257/E29.323; 257/E21.665

(58) Field of Classification Search
None
See application file for complete search history.

(56) References Cited

U.S. PATENT DOCUMENTS

| | | | |
|---|---|---|---|
| 6,977,801 B2 | 12/2005 | Carey et al. | |
| 7,449,345 B2 | 11/2008 | Horng et al. | |
| 8,269,292 B2 | 9/2012 | Horng et al. | |
| 2011/0062538 A1* | 3/2011 | Rizzo et al. | 257/421 |
| 2012/0155156 A1 | 6/2012 | Watts et al. | |
| 2012/0205758 A1 | 8/2012 | Jan et al. | |

OTHER PUBLICATIONS

"Current-driven excitation of magnetic multilayers," by J.C. Slonczewski, Journal of Magnetism and Magnetic Materials, vol. 159, Jun. 1996, pp. L1-L7, Elsevier Science B.V.
PCT Search Report, PCT/US2014/010309, Mailed: May 13, 2014, Headway Technologies, Inc.

* cited by examiner

*Primary Examiner* — Sonya D McCall Shepard
(74) *Attorney, Agent, or Firm* — Saile Ackerman LLC; Stephen B. Ackerman

(57) ABSTRACT

A MTJ is disclosed with a discontinuous Mg or Mg alloy layer having a thickness from 1 to 3 Angstroms between a free layer and a capping layer in a bottom spin valve configuration. It is believed the discontinuous Mg layer serves to block conductive material in the capping layer from diffusing through the free layer and into the tunnel barrier layer thereby preventing the formation of conductive channels that function as electrical shunts within the insulation matrix of the tunnel barrier. As a result, the "low tail" percentage in a plot of magnetoresistive ratio vs Rp is minimized which means the number of high performance MTJ elements in a MTJ array is significantly increased, especially when a high temperature anneal is included in the MTJ fabrication process. The discontinuous layer is formed by a low power physical vapor deposition process.

17 Claims, 5 Drawing Sheets

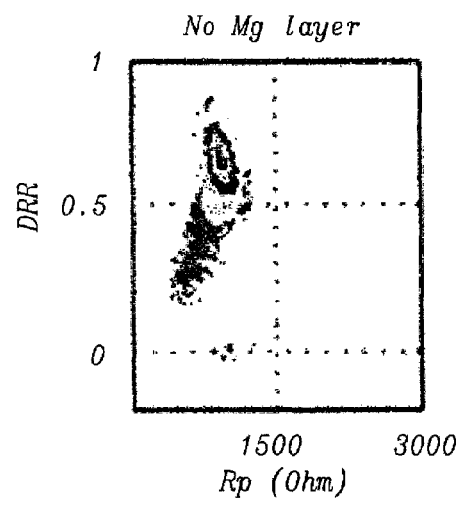
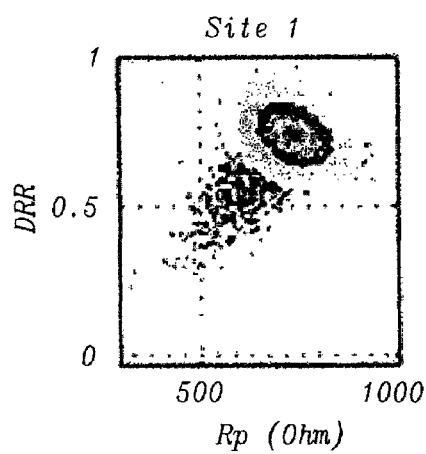
FIG. 7a    FIG. 7b
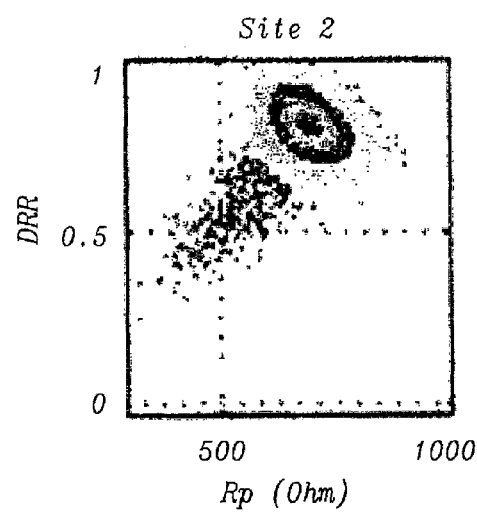
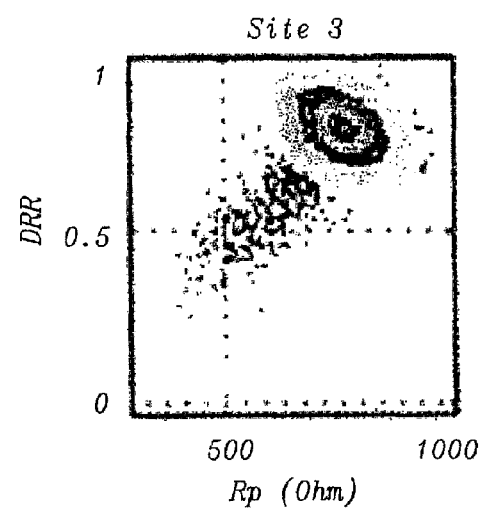
FIG. 7c    FIG. 7d

MG DISCONTINUOUS INSERTION LAYER FOR IMPROVING MTJ SHUNT

RELATED PATENT APPLICATION

This application is related to the following: Ser. No. 12/931,866, filing date Feb. 11, 2011; assigned to a common assignee and herein incorporated by reference in its entirety.

TECHNICAL FIELD

The present disclosure relates to a high performance Magnetic Tunneling Junction (MTJ) element for spintronic devices, and in particular, to a MTJ structure that minimizes electrical shunting and thereby improves the fabrication yield of MTJ elements with a high magnetoresistive ratio.

BACKGROUND

Magnetoresistive Random Access Memory (MRAM), based on the integration of silicon CMOS with MTJ technology, is a major emerging technology that is highly competitive with existing semiconductor memories such as SRAM, DRAM, and Flash. Similarly, spin-transfer (spin torque) magnetization switching found in STT-RAM and described by C. Slonczewski in "Current driven excitation of magnetic multilayers", J. Magn. Magn. Mater. V 159, L1-L7 (1996), has recently stimulated considerable interest due to its potential application for spintronic devices on a gigabit scale.

Both MRAM and STT-RAM have a MTJ element based on a tunneling magneto-resistance (TMR) effect wherein a stack of layers has a configuration in which two ferromagnetic layers are separated by a thin non-magnetic dielectric layer. The MTJ element is typically formed between a bottom electrode such as a first conductive line and a top electrode which is a second conductive line at locations where the top electrode crosses over the bottom electrode. A MTJ stack of layers may have a bottom spin valve configuration in which a seed layer, a ferromagnetic "reference" layer, a thin tunnel barrier layer, a ferromagnetic "free" layer, and a capping layer are sequentially formed on a bottom electrode. The free layer has a magnetic moment that is either parallel or anti-parallel to the magnetic moment in the reference layer. The tunnel barrier layer is thin enough that a current through it can be established by quantum mechanical tunneling of conduction electrons. The magnetic moment of the free layer may change in response to external magnetic fields and it is the relative orientation of the magnetic moments between the free and reference layers that determines the tunneling current and therefore the resistance of the tunneling junction. When a sense current is passed from the top electrode to the bottom electrode in a direction perpendicular to the MTJ layers, a lower resistance is detected when the magnetization directions of the free and reference layers are in a parallel state ("1" memory state) and a higher resistance is noted when they are in an anti-parallel state or "0" memory state.

In a read operation, the information stored in a MRAM cell is read by sensing the magnetic state (resistance level) of the MTJ element through a sense current flowing top to bottom through the cell in a current perpendicular to plane (CPP) configuration. As the size of MRAM cells decreases, the use of external magnetic fields generated by current carrying lines to switch the magnetic moment direction becomes problematic. One of the keys to manufacturability of ultra-high density MRAMs is to provide a robust magnetic switching margin by eliminating the half-select disturb issue. For this reason, a new type of device called a spin transfer (spin torque) MRAM (STT-RAM) was developed. Compared with conventional MRAM, STT-RAM has an advantage in avoiding the half select problem and writing disturbance between adjacent cells. The spin-transfer effect arises from the spin dependent electron transport properties of ferromagnetic-spacer-ferromagnetic multilayers. When a spin-polarized current transverses a magnetic multilayer in a CPP configuration, the spin angular moment of electrons incident on a ferromagnetic layer interacts with magnetic moments of the ferromagnetic layer near the interface between the ferromagnetic and non-magnetic spacer. Through this interaction, the electrons transfer a portion of their angular momentum to the ferromagnetic layer. As a result, spin-polarized current can switch the magnetization direction of the ferromagnetic layer if the current density is sufficiently high, and if the dimensions of the multilayer are small. The difference between a STT-RAM and a conventional MRAM is only in the write operation mechanism. The read mechanism is the same.

A high performance MRAM MTJ element is characterized by a high tunneling magnetoresistive (TMR) ratio which is dR/R (also known as DRR) where R is the minimum resistance of the MTJ element and dR is the change in resistance observed by changing the magnetic state of the free layer. A high TMR ratio and resistance uniformity (Rp_cov), and a low switching field (Hc) and low magnetostriction ($\lambda_s$) value are desirable for conventional MRAM applications. For Spin-RAM (STT-RAM), a high $\lambda_s$ and high Hc leads to high anisotropy for greater thermal stability. This result is accomplished by (a) well controlled magnetization and switching of the free layer, (b) well controlled magnetization of a reference layer that has a large exchange field and high thermal stability and, (c) integrity of the tunnel barrier layer. In order to achieve good tunnel barrier properties such as a specific junction resistance×area (RA) value and a high breakdown voltage (Vb), it is necessary to have a uniform tunnel barrier layer which is free of pinholes. Furthermore, electrical shunting must be minimized to avoid undesirable degradation of the magnetoresistive (TMR) ratio.

An electrical shunt is often observed as a "low tail" in the DRR (TMR ratio) vs. resistance in parallel state (Rp) plot as shown in FIG. 1. The cluster 3 of data points outside the main population 2 and spreading toward zero DDR and zero Rp is defined as the "low tail". MTJs with this low tail population are undesirable for STT-MRAM applications since they have a small DRR as well as low Rp. This result occurs because as the electrical short (shunt) becomes greater, more current passes through the shunting pathways and does not contribute to tunnel magnetoresistance.

To our knowledge, current MTJ technology does not provide a means of minimizing the number of MTJ elements with a "low tail" character while maintaining high DRR. Therefore, an improved MTJ structure is needed to reduce the occurrence of electrical shunting which will in turn increase the yield of "good" MTJs that are acceptable for high performance devices.

SUMMARY

One objective of the present disclosure is to provide a MTJ structure for a STT-RAM that reduces electrical shunting as indicated by minimizing the percentage of the low tail population in a DRR vs. Rp plot to 1% or less while maintaining other properties including TMR ratio, coercivity (Hc), and resistance×area (RA) value.

A second objective of the present disclosure is to provide a fabrication method for forming a high density STT-RAM comprised of a MTJ according to the first objective.

According to one embodiment, these objectives are achieved by providing a substrate comprised of a bottom conductor electrode (BE) on which a spin-transfer (STT)-RAM structure is to be fabricated. The BE may be a composite that includes an uppermost Ta layer which is sputter etched to form an amorphous surface that promotes smooth and flat overlying layers in the MTJ. Once the BE is patterned to form an array of lines, a MTJ stack of layers is formed by sequentially depositing a seed layer, reference layer, tunnel barrier layer, free layer, Mg or Mg alloy layer, and a capping layer in a bottom spin valve configuration. Furthermore, the reference layer may have a synthetic antiferromagnetic (SAF) configuration with an AP2 layer contacting the seed layer, a middle coupling layer, and an AP1 layer contacting the tunnel barrier layer. The tunnel barrier layer is preferably comprised of crystalline MgO or another metal oxide. The free layer may be Fe, Co, or Ni, or an alloy thereof and may include B with one or more of Fe, Co, and Ni such as a CoFeB, NiFeB, or CoFeNiB layer. In an alternative embodiment, the free layer is FePt, CoPt, or a L10 ordered alloy thereof. In yet another embodiment, the free layer has intrinsic perpendicular magnetic anisotropy (PMA) and is a laminated stack of layers with a $(Co/Ni)_n$, $(CoFe/Ni)_n$, $(Co/NiFe)_n$, $(CoFe/NiFe)_n$, $(Co/NiCo)_n$, or $(CoFe/NiCo)_n$ configuration or the like where n is the number of laminations.

A key feature of the present disclosure is the insertion of a very thin discontinuous Mg or MgM layer having an island structure where M is one of Ta, Ti, V, Mo, Zr, Hf, Pt, Pd, W, Nb, Rh, Ru, Cu, Cr, or Ir between the free layer and capping layer. Preferably, the M content in a MgM layer is less than 5 atomic %, and the thickness of the Mg or MgM discontinuous layer is from 1 to 10 Angstroms, and more preferably between 1 and 3 Angstroms. The capping layer may be a dielectric layer but is preferably made of a non-magnetic metal or metal composite that is one or more of Ta, Ti, V, Mo, Zr, Hf, Pt, Pd, W, Nb, Rh, Ru, Cu, Cr, and Ir.

In another embodiment, a MTJ with a top spin valve configuration is formed on the bottom electrode. In this case, a seed layer, Mg or MgM discontinuous layer, free layer, tunnel barrier layer, SAF reference layer, antiferromagnetic (AFM) layer, and a capping layer are sequentially formed on the BE. The AFM layer may be omitted if the reference layer has PMA.

All of the layers in the MTJ stack may be formed by sputtering or ion beam deposition (IBD). Once all the layers in the MTJ stack are laid down, a thermal anneal process is typically employed to fix the reference layer magnetization (easy-axis) direction. The MTJ stack is patterned with a photolithography step to define a MTJ shape in a photoresist masking layer followed by a RIE or ion beam etch (IBE) process to transfer the MTJ shape through the MTJ stack and form a MTJ nanopillar having substantially vertical sidewalls that enable highly dense MTJ arrays necessary for Gbit STT-RAM devices.

BRIEF DESCRIPTION OF THE DRAWINGS

FIGS. 7a-7f are DRR vs. Rp plots for MTJs having different discontinuous Mg layer thicknesses between a free layer and a capping layer in a bottom spin valve configuration according to an embodiment of the present disclosure.

DETAILED DESCRIPTION

Figure 1:
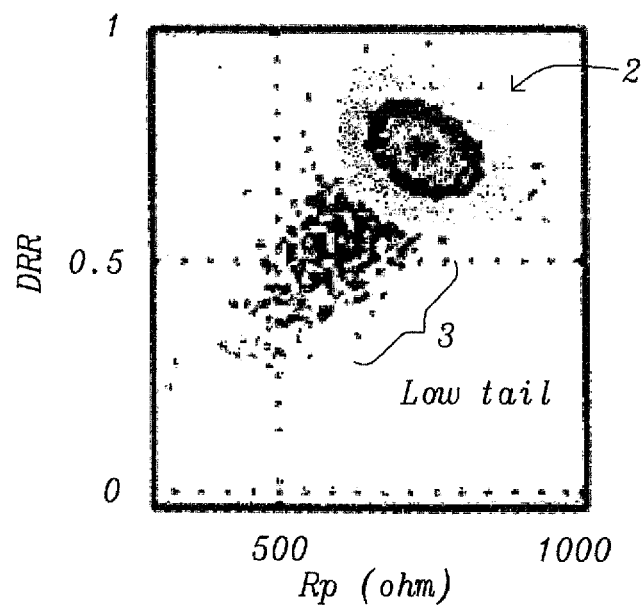
FIG. 1 is a typical plot of DRR (TMR ratio) vs. Rp for a STT-RAM chip with a total of 42,000 MTJs.

The present disclosure is a MTJ structure for a magnetic sensor, STT-RAM or other spintronic application that reduces electrical shunting while maintaining properties such as high dR/R, low RA, and low critical current density which are necessary for enhanced performance in high density STT-RAMs. Drawings are provided by way of example and are not intended to limit the scope of the disclosure. The exemplary embodiments depict a single MTJ element rather than a plurality of MTJs found in a typical MRAM array in order to focus on a key feature which is a discontinuous Mg or Mg alloy layer formed between a tunnel barrier layer and a capping layer in each MTJ stack. Although only bottom spin valve and top spin valve embodiments are depicted, the present disclosure also encompasses MTJ structures having a dual spin valve configuration.

In a previous application, HMG10-038, we described how a continuous Mg layer formed between a free layer and capping layer serves to enhance PMA (Hk) in the adjoining free layer. Herein, we disclose that by forming a very thin discontinuous film of Mg or a MgM alloy between a free layer and capping layer in a bottom spin valve configuration or between a free layer and seed layer in a top spin valve configuration, PMA in the free layer is maintained while advantageously reducing the likelihood of electrical shunting within the tunnel barrier layer in a MTJ stack of layers.

As mentioned previously, electrical shunting degrades the performance of a MTJ element. One of the possible reasons for electrical shunting is the formation of highly conductive channels within the tunnel barrier layer that are created by the diffusion of conductive materials above and/or below the tunnel barrier layer. For example, it is believed that Ta in a commonly used Ta capping layer has a high rate of diffusion and can migrate through the free layer and into a tunnel barrier layer in a bottom spin valve configuration. Ta is also frequently used in a bottom electrode or as a seed layer and is able to diffuse through a free layer and into a tunnel barrier layer in a top spin valve configuration. Therefore, it is important to prevent the diffusion of conductive elements into the tunnel barrier to reduce the probability of a MTJ shunt. We have found that inserting an appropriate blocking layer between the capping layer and tunnel barrier layer (or between a seed layer and tunnel barrier layer) is very effective in significantly reducing the diffusion of highly conductive elements like Ta from entering the tunnel barrier layer thereby maintaining the integrity of the tunnel barrier. Moreover, the blocking layer must be thin enough so as not to deteriorate important magnetic properties such as DRR (TMR ratio), PMA, Hc, and RA value. Although not bound by theory, it is believed that segregated islands of Mg or a MgM alloy, instead of a continuous metal or alloy film, are necessary to maintain PMA in the underlying free layer by allowing limited contact of the capping layer at an interface with a top surface of the free layer and thereby promote interfacial perpendicular anisotropy within the free layer. Similarly, in a top spin valve configuration, a discontinuous Mg or MgM alloy layer enables limited contact of the free layer with the seed layer to promote interfacial perpendicular anisotropy along a bottom surface of the free layer.

Figure 2:
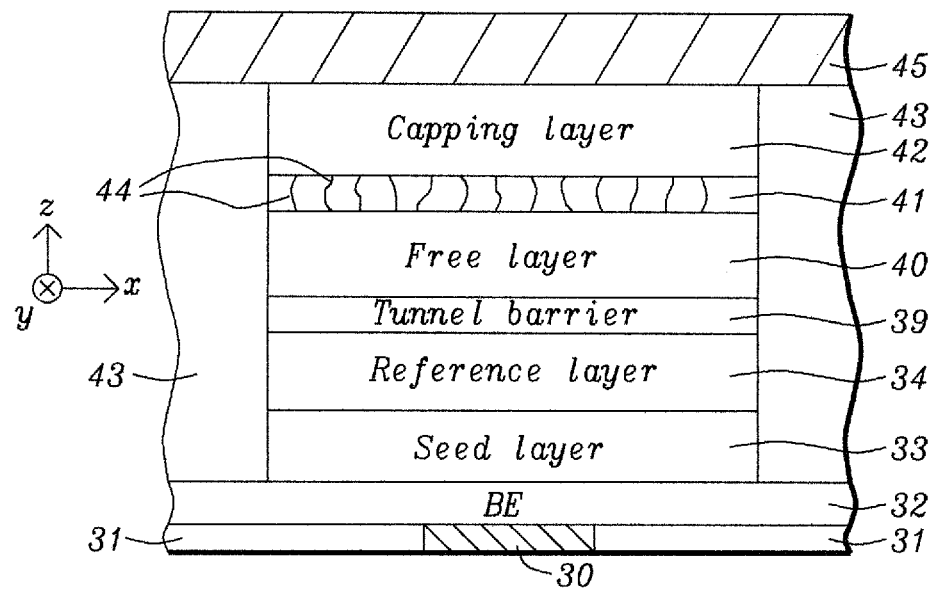
FIG. 2 is a cross-sectional view of a STT-RAM that shows a MTJ element with a bottom spin valve configuration and a discontinuous Mg layer between a free layer and capping layer according to a first embodiment of the present disclosure.

Referring to FIG. 2, one embodiment of a MTJ according to the present disclosure is depicted. A MTJ comprised of layers 33-42 is formed between a bottom electrode 32 and a bit line 45 in an STT-RAM array (not shown). The bottom electrode (BE) 32 may be a composite layer comprised of a lower seed layer, middle conductive layer, and upper capping layer. The BE 32 may be a composite having a TaN/NiCr/Ru/Ta configuration, for example, wherein the lower TaN layer (not shown) is formed on a substrate that may be an insulation layer 31 comprised of silicon oxide, alumina, or the like. However, other materials may be employed as the conductive layer(s) in BE 32. In the exemplary embodiment, there is a metal stud 30 formed in the insulation layer 31 such that a top surface of the metal stud contacts the BE to establish an electrical connection between bit line 45 and a word line (not shown) in a sub-structure below the substrate. Generally, the metal stud is also connected to a transistor drain (not shown) in an underlying sub-structure. The transistor is typically used in a write or read process that determines the resistance state of the bit cell (MTJ) once the MTJ stack of layers is patterned to form a MTJ nanopillar structure and a bit line is formed on the MTJ nanopillar. Unlike conventional MRAM, magnetization switching in a STT-RAM MTJ is accomplished by passing current through a bit cell and not by fields induced by current in a word line and a bit line. BE 32 may have an area size in the "x, y" plane greater than that of the overlying MTJ layers.

An amorphous Ta top surface on BE 32 is especially advantageous in promoting a uniform and dense growth in subsequently formed MTJ layers. It is important that the tunnel barrier 39 must be extremely uniform over the wafer since small variations in thickness will result in a large variation in the resistance and in the RA value. In one embodiment, the BE 32 is patterned to form an array of BE lines and then an insulation layer (not shown) is deposited and planarized by a conventional method to become coplanar with the BE.

In the first embodiment, the MTJ stack is fabricated on the patterned BE 32 by sequentially forming a seed layer 33, reference layer 34, tunnel barrier layer 39, free layer 40, discontinuous Mg or MgM insertion layer 41, and capping layer 42. Seed layer 33 is preferably NiCr but may be comprised of TiN, NiFe, NiFeCr, or other suitable seed layer materials. The seed layer, also known as a buffer layer, promotes smooth and densely packed growth in subsequently formed MTJ layers.

In the most general embodiment of the present disclosure, the reference layer 34 is a single ferromagnetic layer or a composite wherein each ferromagnetic layer has a magnetic moment aligned in the same x-axis direction that is "in-plane". Alternatively, the reference layer may comprise a laminate represented by $(A1/A2)_n$ wherein A1 is a first metal or alloy comprising one or more of Co, Ni, and Fe, A2 is a second metal or alloy comprising one or more of Co, Fe, Ni, Pt, and Pd, n is the number of laminates in the $(A1/A2)_n$ stack, and A1 is unequal to A2. Typically, the $(A1/A2)_n$ laminate has intrinsic PMA wherein the magnetic moment is aligned perpendicular to the plane of the substrate in a z-axis direction. In other words, PMA means that each layer in the laminate has a magnetic moment aligned perpendicular to the plane of that layer.

Above the reference layer is a tunnel barrier layer 39. A preferred material for the tunnel barrier layer is MgO that may be deposited by RF magnetron sputtering directly from a sintered MgO target, or formed by a procedure where a first Mg layer about 6 to 8 Angstroms thick is DC-magnetron sputtered followed by an in-situ natural oxidation (NOX), and then sputter deposition of a second Mg layer about 3 to 5 Angstroms thick. The second method involving a DC sputtering process with a metallic Mg target results in a uniform Mg film that is particulate free. The desired RA value for the STT-RAM MTJ of less than about 15 ohm-$\mu m^2$ can be achieved by adjusting Mg thickness and NOX process conditions. Typically, the NOX process is performed in an oxidation chamber within a DC-magnetron sputter deposition tool and comprises an oxygen flow rate of 0.1 to 1 standard liters per minute (slm) for a period of 100 to 600 seconds. It is believed that the oxygen in the MgO layer resulting from the NOX process diffuses into the second Mg layer to form a uniform MgO layer in which essentially all of the first and second Mg layers are oxidized. The present disclosure also anticipates that the tunnel barrier layer may be comprised of other metal oxides such as $Al_2O_3$, TiOx, or HfOx.

There is a free layer 40 that contacts a top surface of the tunnel barrier layer 39. In one aspect, the free layer may be a single layer or composite that comprises one or more of Fe, Co, and Ni, or an alloy thereof. Furthermore, the free layer may comprise an alloy of one or more of Fe, Co, and Ni that includes boron as in CoFeB or CoFeNiB, for example, in a single layer or in a bilayer or trilayer configuration wherein at least one of the layers contains boron. According to one preferred embodiment, the reference layer/tunnel barrier/free layer structure has a CoFeB/MgO/CoFeB configuration which is known to provide a high magnetoresistive ratio. Preferably, a CoFeB, NiFeB, or CoFeNiB free layer has a thickness less than about 16-20 Angstroms so that interfacial perpendicular anisotropy at a first interface with a tunnel barrier layer (MgO) and at a second interface with an overlying metal layer overcomes the in-plane magnetic moment to generate a free layer with PMA. In an alternative embodiment, the free layer may have intrinsic PMA and be comprised of FePt or CoPt, or a L10 ordered alloy with a DE composition wherein D is Fe, Co, Ni, or an alloy thereof and E is Rh, Pd, Pt, Ir, or an alloy thereof. The present disclosure also encompasses an embodiment wherein the free layer is a rare earth-transition metal (RE-TM) alloy such as TbCo, TbFeCo, or GdFeCo that exhibits PMA.

The present disclosure also anticipates that the free layer may be a composite including a layer which is an L10 ordered alloy, and a layer that is an alloy of one or more of Fe, Co, and Ni that also contains boron. In another aspect, the free layer may be a composite that has a layer made of one or more of Fe, Co, and Ni, and a second layer comprising one or more of Fe, Co, and Ni with B. Moreover, there may be a free layer with a first layer having one or more of Fe, Co, and Ni with B, and a second layer containing one or more of Fe, Co, and Ni with B wherein the first layer has a different atomic % content in at least two of the elements in FeCoNiB compared with the composition in the second layer.

A key feature of the present disclosure is a thin discontinuous layer 41 with a thickness from 1 to 10 Angstroms, and preferably 1 to 3 Angstroms, formed between the free layer and an overlying capping layer 42. Although the discontinuous layer has channels 44 formed therein to separate island like structures of Mg or MgM alloy, the layer 41 effectively serves as a blocking layer to significantly reduce the diffusion of conductive materials such as Ta in the capping layer into the free layer, and especially into the tunnel barrier layer 39 during high temperature annealing up to 400° C. or higher, thereby minimizing the probability of an electrical shunt. Preferably, the discontinuous layer is made of Mg, or a MgM alloy where M is one of Ta, Ti, V, Mo, Zr, Hf, Pt, Pd, W, Nb, Rh, Ru, Cu, Cr, or Ir with a M content less than 5 atomic % in the MgM alloy. We have found the optimum benefit of a Mg or MgM discontinuous layer in terms of a smaller "low tail" occurs when the discontinuous layer thickness is maintained from 1.3 to 2.7 Angstroms. For thicknesses greater than about 3 Angstroms, the advantageous effect of layer 41 is substantially diminished because PMA in the free layer rapidly degrades. As mentioned earlier, it is believed that the channels 44 are necessary to enable a limited amount of contact between the free layer and a metal such as Ta in the capping layer so that PMA is induced in the free layer along an interface with the capping layer, and PMA is retained in the free layer. As film thickness for layer 41 becomes greater than approximately 3 Angstroms, channels 44 essentially disappear as the Mg or MgM alloy film achieves a continuous film structure.

The discontinuous layer is preferably deposited by a physical vapor deposition (PVD) technique. Note that typical PVD processes have a power in the range of 150 to 1000 Watts. However, this standard procedure is not applicable to reproducibly forming a discontinuous layer 41 because the deposition rate under standard power conditions would be a least 1 Angstrom per second which is too high to yield a film thickness that is controlled between 1 and 3 Angstroms. We have discovered that a low power modification wherein the PVD power is reduced to a range of 20 to 500 Watts, and preferably to 25 Watts is an acceptable method for manufacturing a reproducible 1 to 3 Angstrom thickness. The deposition rate is determined in a preliminary experiment by depositing a relatively thick film over an extended period of time, and dividing the resulting film thickness by the deposition time.

Figure 3:
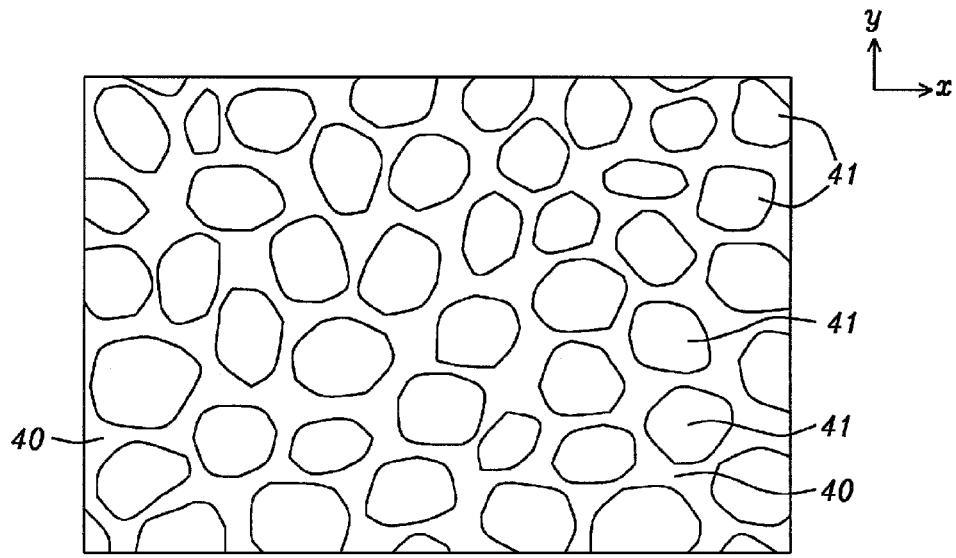
FIG. 3 is a top-down view of a discontinuous Mg layer formed on a free layer according to an embodiment of the present disclosure.

From a top down view in FIG. 3, the discontinuous Mg layer 41 is depicted following a low power PVD deposition and before the capping layer is formed. The discontinuous layer is comprised of a plurality of island shapes. A portion of the top surface of underlying free layer 40 is visible through spaces (channels) within discontinuous layer 41. It should be understood that the size (area in x, y plane) of the islands is generally not uniform, and spacing between islands varies. Island size and spacing are a function of deposition time in the PVD process.

The uppermost layer in the MTJ stack is a capping layer 42 that is a dielectric layer or non-magnetic metal comprised of one or more of Ta, Ti, V, Mo, Zr, Hf, Pt, Pd, W, Nb, Rh, Ru, Cu, Cr, or Ir that provides good electrical contact with an overlying metal line (top electrode) such as bit line 45 or metal layer (top shield in a TMR sensor), and has good etch resistance. Ta exhibits good etch resistance and thermal stability, and also promotes high PMA in free layer 40.

The MTJ stack comprised of layers 33-42 may be formed in the same process tool as the bottom electrode layer 32. For instance, the bottom electrode 32 and MTJ stack may be formed in an Anelva C-7100 thin film sputtering system or the like which typically includes three physical vapor deposition (PVD) chambers, an oxidation chamber, and a sputter etching chamber. At least one of the PVD chambers is capable of co-sputtering to form a discontinuous MgM alloy layer 41. Usually, the sputter deposition process involves an argon sputter gas and the targets are made of metal or alloys to be deposited on a substrate. The bottom electrode layer 32 and overlying MTJ layers 33-42 may be formed after a single pump down of the sputter system to enhance throughput. The NOX process used to form the MgO barrier layer 39 is typically performed in an oxidation chamber within the sputter deposition tool.

Once the MTJ stack of layers 33-42 is laid down on the patterned BE 32, a high temperature annealing may be performed. For example, MTJ layers 33-42 may be annealed with or without application of a magnetic field of 5000 to 10000 Oe in magnitude along the x-axis (easy axis) for 1 minute to 5 hours at a temperature of about 300° C. to 400° C. Thereafter, an array of MTJ elements (nanopillars) with substantially vertical sidewalls may be fabricated by a conventional sequence involving a photolithography process to pattern a photoresist layer (not shown) that is formed on a top surface of the capping layer 42, and then an etch transfer comprising a reactive ion etch (RIE) or ion beam etch (IBE) to transfer the pattern through the MTJ stack of layers. After the pattern of MTJ nanopillars is formed, the photoresist layer is stripped, and an insulation layer 43 is deposited and subsequently planarized by a chemical mechanical polish (CMP) process such that a top surface thereof is essentially coplanar with a top surface of the capping layer 42. Next, a bit line 45 that is part of a bit line array (not shown) is formed on the capping layer and insulation layer 43 by a conventional process.

Figure 4:
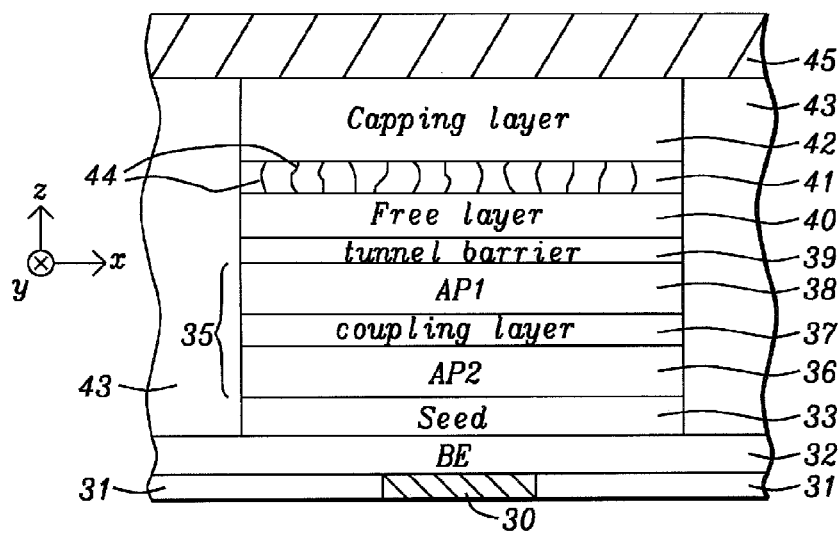
FIG. 4 is a cross-sectional view of a STT-RAM that depicts a MTJ with a bottom spin valve configuration and a discontinuous Mg layer between a free layer and capping layer according to a second embodiment of the present disclosure.

Referring to FIG. 4, a second embodiment of the present disclosure is depicted that retains all of the features of the first embodiment except the reference layer is replaced by a synthetic antiferromagnetic (SAF) reference layer 35 wherein antiferromagnetic (AF) coupling is established between a lower AP2 layer 36 and an upper AP1 layer 38 by a coupling layer 37. The AP2 layer contacts a top surface of the seed layer 33, and the AP1 layer contacts a bottom surface of the tunnel barrier layer 39. In one aspect, one or both of the AP1 and AP2 layers may be comprised of one or more or Co, Fe, and Ni, or an alloy thereof with B. In an alternative embodiment, one or both of the AP1 and AP2 layers are comprised of a laminated structure $(A1/A2)_n$ with intrinsic PMA as described previously. The resulting SAF reference layer may be represented by $(A1/A2)_n/Ru/(A1/A2)_m$ configuration where n and m are each from 1 to 10. Note that n is not necessarily equal to m. In this case, the lower AP2 layer with n laminations contacts the seed layer and the upper AP1 layer with m laminations contacts the tunnel barrier. In yet another embodiment, one or both of the AP1 and AP2 layers are made of CoPt, FePt or an ordered L10 alloy thereof. Preferably, the coupling layer 37 is Ru although other metals such as Rh and Ir that induce AF coupling are acceptable.

Figure 5:
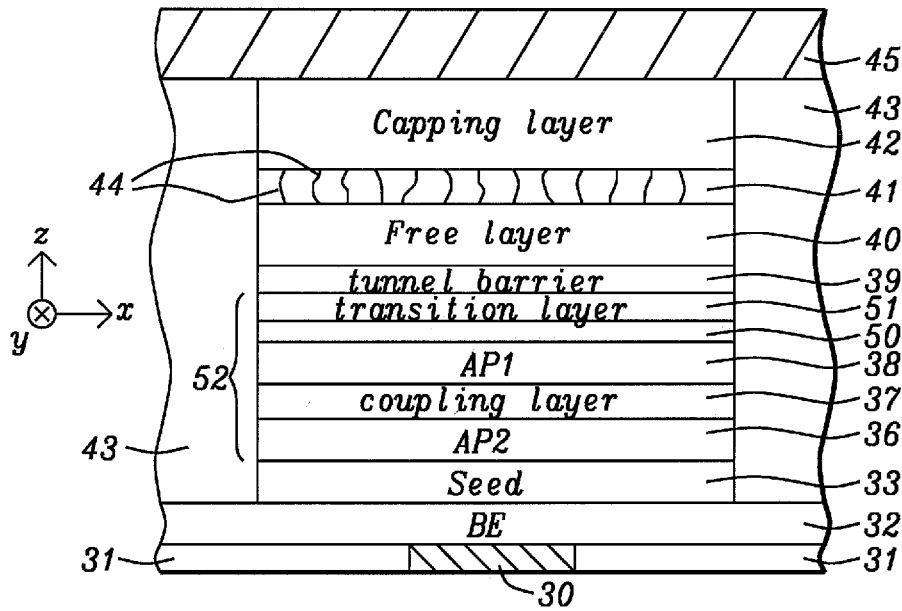
FIG. 5 is a cross-sectional view of a STT-RAM formed according to a third embodiment wherein the MTJ in FIG. 4 is modified by inserting a dusting layer and transition layer between the reference layer and tunnel barrier layer.

Referring to FIG. 5, a third embodiment is illustrated that retains all of the features in the second embodiment. Preferably, the reference layer includes an AP2/Ru/AP1 configuration wherein AP2 is $(A1/A2)_n$ and contacts the seed layer, and the AP1 layer is $(A1/A2)_m$. In addition, a thin Ta dusting layer 50 and a transition layer 51 made of CoFeB or CoFeB/Co, for example are sequentially formed on the AP1 layer. In other words, a modified reference layer 52 is formed wherein a thin Ta layer 50 about 1.5 Angstroms thick contacts a top surface of the uppermost layer in laminated AP1 layer 38 and the transition layer 51 contacts a bottom surface of the tunnel barrier layer. The transition layer is ferromagnetically coupled to the uppermost layer in the AP1 laminated stack. The advantage of the third embodiment is that a higher MR ratio is achieved because of the CoFeB layer formed adjacent to the tunnel barrier layer. Preferably, an amorphous CoFeB transition layer crystallizes to a bcc structure during post-deposition annealing thereby increasing TMR especially when adjoining a (100) MgO tunnel barrier layer. A CoFeB layer thickness is selected between 6 and 14 Angstroms that is a compromise between a thick layer for higher MR ratio and a thin layer that enables PMA and provides high coercivity such that reference layer Hc>free layer Hc. A Co layer may be included as the uppermost layer in a composite transition layer since Co is more resistant to oxidation from the tunnel barrier layer than a CoFeB layer. As a result, a combination of high coercivity and PMA are provided by reference layer 52. The thin dusting layer is responsible for good electrical properties (high TMR).

Figure 6:
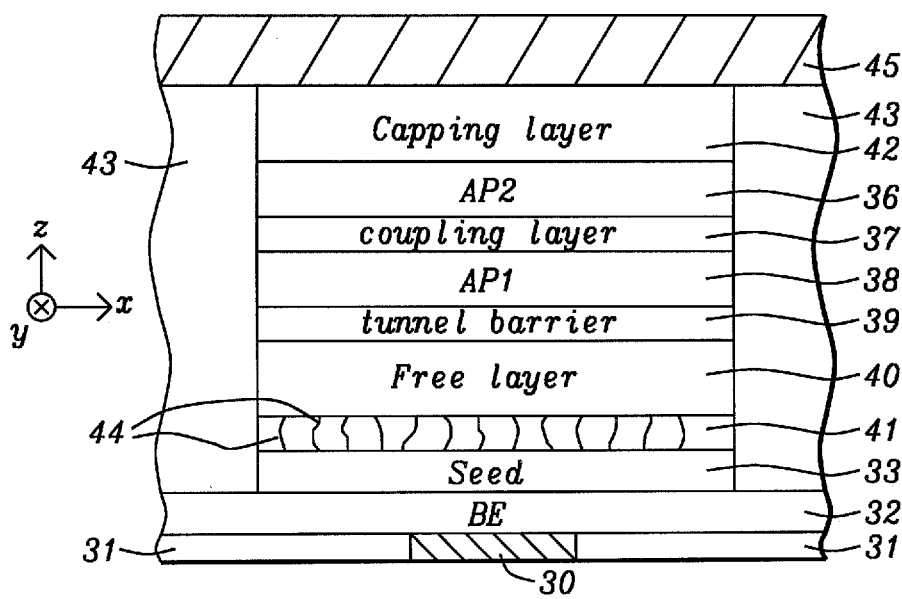
FIG. 6 is a cross-sectional view of a STT-RAM that depicts a MTJ with a top spin valve configuration and a discontinuous Mg layer between a seed layer and a free layer according to a fourth embodiment of the present disclosure.

According to a fourth embodiment in FIG. 6 that has a top spin valve configuration, a seed layer 33, discontinuous Mg or MgM layer 41, free layer 40, tunnel barrier 39, AP1 layer 38, coupling layer 37, AP2 layer 36, and a capping layer 42 are sequentially formed in order from bottom to top on a BE 32. In an alternative embodiment wherein the AP2 layer has a magnetic moment "in plane" or aligned along the x-axis direction, an AFM layer (not shown) is inserted between the AP2 layer and capping layer. The antiferromagnetic (AFM) layer 34 is preferably comprised of MnPt although an IrMn layer other materials such as NiMn, OsMn, RuMn, RhMn, PdMn, RuRhMn, or MnPtPd are also acceptable. SAF reference layer 35 with an AP1/coupling/AP2 configuration improves thermal stability of the MTJ and also reduces the interlayer coupling Hin (offset) field applied to the free layer.

To demonstrate the improvement in performance realized by incorporating an insertion layer of the present disclosure in a MTJ structure, a series of MTJ nanopillars each having a different discontinuous Mg layer thickness were fabricated on an AlTiC substrate and the resulting magnetic properties are found in Table 1. The MTJ in this experiment has a TiN/NiCr45/(Co/Ni)$_{10}$/Ru4/(Co/Ni)$_4$/Ta1.5/CoFeB12/Co4/MgO/Co$_{20}$Fe$_{50}$B$_{30}$12/Mg/Ta configuration where each number following the layer composition is the thickness in Angstroms. In this case, TiN/NiCr is a composite seed layer, (Co/Ni)$_{10}$/Ru/(Co/Ni)$_4$ is the reference layer, Ta is a dusting layer between the reference layer and a CoFeB/Co transition layer, MgO is the tunnel barrier layer, CoFeB is the free layer, Mg represents a discontinuous layer, and Ta is the capping layer as previously described with regard to the third embodiment. The MgO layer was prepared by depositing a first Mg layer with an 8 Angstrom thickness on the reference layer, performing a natural oxidation, and then depositing a second Mg layer with a 4 Angstrom thickness. Following an annealing step at 400° C. for 30 minutes, the tunnel barrier becomes an essentially uniform MgO layer. The MTJ stack of layers is then patterned by a conventional sequence involving a photolithography process and ion beam etch to form nanopillars having a circular shape from a top-down view with easy axis and hard axis dimensions of 80 nm each.

TABLE 1

Magnetic Properties of MTJs with a TiN/NiCr45/(Co/Ni)$_{10}$/Ru/ (Co/Ni)$_4$/Ta1.5/CoFeB12/Co4/MgO/Co$_{20}$Fe$_{50}$B$_{30}$12/Mg/Ta configuration

| Site | Mg thickness (nm) | Low tail % | DRR % | Rp (ohm) | Hc (Oe) |
|---|---|---|---|---|---|
| No Mg | 0 | 1.5 | 65 | 925 | 525 |
| 1 | 0.13 | 1.2 | 74 | 755 | 575 |
| 2 | 0.17 | 1.0 | 80 | 715 | 575 |
| 3 | 0.20 | 0.9 | 79 | 775 | 575 |
| 4 | 0.23 | 0.8 | 76 | 775 | 550 |
| 5 | 0.27 | 0.9 | 74 | 775 | 600 |

Figures 7E, 7F:
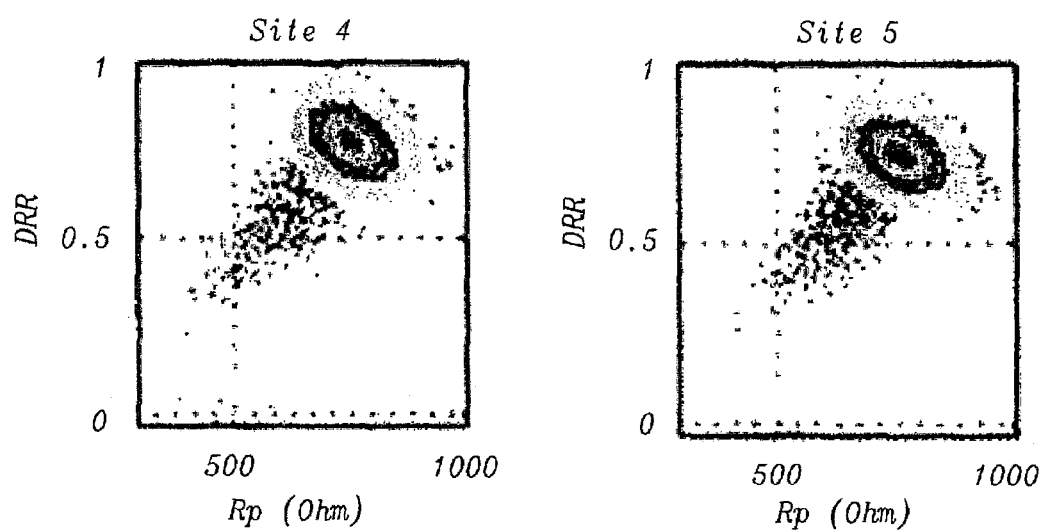

As indicated in Table 1, the low tail % in the plot of DRR vs. Rp (FIGS. 7a-7f) is desirably reduced when a discontinuous Mg layer is inserted between the free layer and capping layer. Note that row 1 (no Mg layer) in Table 1 is associated with FIG. 7a, row 2 (0.13 nm thick Mg layer) is related to FIG. 7b, and so forth through row 6 and a 0.27 nm thick Mg layer (FIG. 7f). The change in low tail percentage from 1.5% to 0.9% is statistically appreciable considering a total of 42000 MTJs were measured to determine the low tail % in each row in Table 1. Another important achievement is that none of the other critical properties such as DRR %, Rp, and Hc are degraded by including a discontinuous Mg insertion layer. In fact, DRR % increases while Rp decreases which are both considered improvements in performance. Similar results are expected when a discontinuous MgM alloy layer with M limited to less than 5 atomic % is used to replace the Mg layer.

We have discovered that inclusion of a discontinuous Mg or MgM alloy layer between a free layer and capping layer in a bottom spin valve design, or between a seed layer and free layer in a top spin valve structure, not only improves MTJ performance by minimizing the low tail % in a DRR vs. Rp plot, but also provides the capability to enhance DRR % and lower Rp for better overall performance of the MTJ nanopillar in a STT-MRAM device. Similar improvements are expected in a TMR sensor or other spintronic devices that comprise a discontinuous Mg or MgM layer between a free layer and capping layer in a bottom spin valve MTJ structure. The advantages realized with a discontinuous Mg or MgM layer as described herein are believed to result from a blocking effect where the discontinuous layer significantly restricts a highly conductive metal such as Ta from diffusing from a capping layer or from a seed layer through the free layer and into the tunnel barrier layer, and thereby avoids the formation of highly conductive channels within the insulation matrix of the tunnel barrier layer.

While this disclosure has been particularly shown and described with reference to, the preferred embodiment thereof, it will be understood by those skilled in the art that various changes in form and details may be made without departing from the spirit and scope of this disclosure.

We claim:

1. A magnetic tunnel junction (MTJ), comprising:
   (a) a free layer having perpendicular magnetic anisotropy (PMA) that contacts a top surface of a tunnel barrier layer;
   (b) a non-magnetic capping layer as the uppermost layer in the MTJ; and
   (c) a discontinuous Mg or MgM alloy insertion layer that contacts a top surface of the free layer and a bottom surface of the non-magnetic capping layer where M is one of Ta, Ti, V, Mo, Zr, Hf, Pt Pd, W, Nb, Rh, Ru, Cu, Cr, or Ir, and M has a content less than about 5 atomic % in the MgM alloy.

2. The MTJ of claim 1 wherein the discontinuous Mg or MgM alloy insertion layer has a thickness from about 1 to 3 Angstroms.

3. The MTJ of claim 1 further comprised of a reference layer that contacts a bottom surface of the tunnel barrier layer, the reference layer is comprised of one or more ferromagnetic layers wherein a magnetic moment in each ferromagnetic layer is aligned in the plane of each ferromagnetic layer, or the magnetic moment is aligned perpendicular to the plane in each of the ferromagnetic layers.

4. The MTJ of claim 3 wherein the reference layer is comprised of a laminate represented by (A1/A2)$_n$ wherein A1 is a first metal or alloy comprising one or more of Co, Ni, and Fe, A2 is a second metal or alloy comprising one or more of Co, Fe, Ni, Pt, and Pd, n is the number of laminates in the (A1/A2)$_n$ stack, and A1 is unequal to A2.

5. The MTJ of claim 4 wherein the reference layer has a synthetic antiferromagnetic (SAF) configuration with an AP2/coupling layer/AP1 configuration wherein the AP2 layer contacts a substrate and the AP1 layer contacts a bottom surface of the tunnel barrier layer, and wherein at least one of the AP1 and AP2 layers is comprised of an (A1/A2)$_n$ stack.

6. The MTJ of claim 5 wherein the reference layer has an AP2/coupling layer/AP1 configuration, the (A1/A2)$_n$ laminate is the AP2 layer and there is a (A1/A2)$_m$ laminate as the AP1 layer wherein m and n are each from 1 to 10, and the coupling layer establishes antiferromagnetic coupling between the AP1 and AP2 layers.

7. The MTJ of claim 6 wherein the reference layer is further comprised of a Ta dusting layer that contacts a top surface of the AP1 layer, and a transition layer comprised of CoFeB or CoFeB/Co that contacts a bottom surface of the tunnel barrier layer.

8. The MTJ of claim 1 wherein the free layer is one or more of Fe, Co, and Ni, or is an alloy of one or more of Fe, Co, and Ni that includes boron.

9. The MTJ of claim 1 wherein the free layer is FePt or CoPt, or is a L10 ordered alloy with a DE composition wherein D is Fe, Co, Ni, or an alloy thereof and E is Rh, Pd, Pt, Ir, or an alloy thereof, or the free layer is a rare earth-transition metal (RE-TM) alloy that is TbCo, TbFeCo, or GdFeCo.

10. The MTJ of claim 1 wherein the free layer is a composite that includes a first alloy of one or more of Fe, Co, and Ni with B, and one of a L10 ordered alloy, an alloy of one or more of Fe, Co, and Ni, or a second alloy of one or more of Fe, Co, and Ni with B wherein at least two elements in the second alloy have a different atomic % content than in the first alloy.

11. The MTJ of claim 1 wherein the capping layer is a dielectric layer or non-magnetic layer that is one or more of Ta, Ti, V, Mo, Zr, Hf, Pt, Pd, W, Nb, Rh, Ru, Cu, Cr, or Ir.

12. A magnetic tunnel junction (MTJ), comprising:
(a) a seed layer that is NiCr, TiN, or NiFeCr formed on a substrate;
(b) a free layer formed on the seed layer; and
(c) a discontinuous Mg or MgM alloy layer that contacts a bottom surface of the free layer and a top surface of the seed layer where M is one of Ta, Ti, V, Mo, Zr, Hf, Pt Pd, W, Nb, Rh, Ru, Cu, Cr, or Ir, and M has a content less than about 5 atomic % in the MgM alloy.

13. The MTJ of claim 12 wherein the discontinuous Mg or MgM alloy layer has a thickness from about 1 to 3 Angstroms.

14. The MTJ of claim 12 further comprised of a tunnel barrier layer, reference layer, and capping layer that are sequentially formed on a top surface of the free layer.

15. The MTJ of claim 12 wherein the free layer is one or more of Fe, Co, and Ni, or is an alloy of one or more of Fe, Co, and Ni that includes boron.

16. The MTJ of claim 12 wherein the free layer is FePt or CoPt, or is a L10 ordered alloy with a DE composition wherein D is Fe, Co, Ni, or an alloy thereof and E is Rh, Pd, Pt, Ir, or an alloy thereof, or the free layer is a rare earth-transition metal (RE-TM) alloy that is TbCo, TbFeCo, or GdFeCo.

17. The MTJ of claim 14 wherein the capping layer is a dielectric layer or non-magnetic layer that is one or more of Ta, Ti, V, Mo, Zr, Hf, Pt, Pd, W, Nb, Rh, Ru, Cu, Cr, or Ir.

* * * * *